(12) United States Patent
Xu (10) Patent No.: US 9,887,255 B2
(45) Date of Patent: Feb. 6, 2018

(54) ARRAY SUBSTRATE, DISPLAY DEVICE, AND METHOD FOR MANUFACTURING ARRAY SUBSTRATE

(71) Applicant: Shenzhen China Star Optoelectronics Technology Co., Ltd., Shenzhen, Guangdong (CN)

(72) Inventor: Xiangyang Xu, Shenzhen, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/785,978

(22) PCT Filed: May 13, 2015

(86) PCT No.: PCT/CN2015/078871
§ 371 (c)(1),
(2) Date: Dec. 30, 2015

(87) PCT Pub. No.: WO2016/161691
PCT Pub. Date: Oct. 13, 2016

(65) Prior Publication Data
US 2017/0148862 A1 May 25, 2017

(30) Foreign Application Priority Data

Apr. 10, 2015 (CN) .......................... 2015 1 0167361

(51) Int. Cl.
*H01L 27/32* (2006.01)
*H01L 27/12* (2006.01)

(52) U.S. Cl.
CPC ...... *H01L 27/3272* (2013.01); *H01L 27/3262* (2013.01); *H01L 27/1214* (2013.01); *H01L 27/1288* (2013.01); *H01L 2227/323* (2013.01)

(58) Field of Classification Search
None
See application file for complete search history.

(56) References Cited

U.S. PATENT DOCUMENTS

| RE38,466 E * | 3/2004 | Inoue | G02F 1/1368 |
| | | | 438/158 |
| 2002/0140879 A1* | 10/2002 | Fujieda | G02F 1/1326 |
| | | | 349/69 |

(Continued)

FOREIGN PATENT DOCUMENTS

| CN | 1917230 | 2/2007 |
| CN | 1921141 | 2/2007 |

(Continued)

OTHER PUBLICATIONS

Search Report and Written Opinion dated Apr. 10, 2015, in International Patent Application No. PCT/CN2015/078871.

(Continued)

*Primary Examiner* — Michael Lebentritt
(74) *Attorney, Agent, or Firm* — Kim Winston LLP (57) ABSTRACT

An array substrate, a display device, and a method for manufacturing the array substrate are disclosed. The array substrate comprises a base substrate, a light-absorbing layer, and a bottom-gate thin film transistor unit arranged in sequence, wherein a projection of the light-absorbing layer covers a gate metal layer, a source metal layer, and a drain metal layer of the bottom-gate thin film transistor unit. According to the present disclosure, the ambient light can be prevented from irradiating the metal layers of the bottom-gate thin film transistor unit effectively in the case that the brightness of the display panel is not reduced.

12 Claims, 5 Drawing Sheets

(56) References Cited

U.S. PATENT DOCUMENTS

| | | | |
|---|---|---|---|
| 2008/0084603 A1 | 4/2008 | Song et al. | |
| 2008/0212000 A1* | 9/2008 | French | G02F 1/133305 349/106 |
| 2008/0227232 A1* | 9/2008 | Yamazaki | G02F 1/136286 438/34 |
| 2011/0012106 A1* | 1/2011 | Yamazaki | H01L 27/124 257/43 |
| 2011/0024751 A1* | 2/2011 | Yamazaki | H01L 27/1225 257/57 |
| 2011/0062433 A1* | 3/2011 | Yamazaki | H01L 27/1225 257/43 |
| 2012/0032179 A1* | 2/2012 | Saitoh | H01L 21/0245 257/59 |
| 2012/0104430 A1* | 5/2012 | Kim | H01L 51/5284 257/91 |
| 2013/0082267 A1* | 4/2013 | Aichi | H01L 27/1214 257/59 |
| 2013/0105797 A1* | 5/2013 | Hayashi | H01L 29/66765 257/57 |
| 2013/0187164 A1* | 7/2013 | Oshima | H01L 29/78693 257/59 |
| 2013/0271690 A1* | 10/2013 | Matsukizono | H01L 27/1225 349/46 |
| 2013/0334530 A1* | 12/2013 | Katoh | H01L 27/1222 257/43 |
| 2015/0333115 A1* | 11/2015 | Yang | H01L 27/12 257/40 |
| 2016/0349614 A1* | 12/2016 | Wright | G03F 7/0046 |
| 2016/0351135 A1* | 12/2016 | Sampsell | G09G 3/20 |
| 2017/0062772 A1* | 3/2017 | Chu | H01L 51/5284 |

FOREIGN PATENT DOCUMENTS

| | | |
|---|---|---|
| CN | 101324733 | 12/2008 |
| CN | 103500756 | 1/2014 |
| CN | 104022123 | 9/2014 |

OTHER PUBLICATIONS

Office Action and Search Report dated Apr. 5, 2017, for Chinese Patent Application No. 201510167361.X.

* cited by examiner

ARRAY SUBSTRATE, DISPLAY DEVICE, AND METHOD FOR MANUFACTURING ARRAY SUBSTRATE

CROSS REFERENCE TO RELATED APPLICATION

The present application claims benefit of Chinese patent application CN 201510167361.X, entitled "Array Substrate, Display Device, and Method for Manufacturing Array Substrate" and filed on Apr. 10, 2015, the entirety of which is incorporated herein by reference.

FIELD OF THE INVENTION

The present disclosure relates to the technical field of display, and particularly to an array substrate, a display device comprising the array substrate, and a method for manufacturing the array substrate.

BACKGROUND OF THE INVENTION

The Active-matrix Organic Light Emitting Diode (AMOLED) is a kind of thin film light-emitting device made of organic semiconductor material and driven by direct voltage. Different from the traditional Liquid Crystal Display (LCD) technology, in the AMOLED display technology, backlight is not needed, and the light can be emitted by an organic material coating with a very small thickness. The light-emitting principle of AMOLED is: when electric current flows in the organic material coating, the organic material in the organic material coating can emit light. The AMOLED display panel can be made lighter and thinner with a larger viewing-angle and the power consumption thereof can be reduced significantly.

The AMOLED display panel comprises a gate metal layer, a source metal layer, and a drain metal layer. These metal layers all have strong light reflection ability. The ambient light can irradiate these metal layers through the opening area of the cover of the display panel and be reflected by the metal layers strongly. Consequently, the display effect of the AMOLED display panel would be adversely affected.

In the prior art, a circular polarizer is generally arranged on the cover so as to prevent part of the ambient light from irradiating the metal layers of the display panel. However, the defect of the above method lies in that, since the opaque region of the circular polarizer does not coincide with the region of the metal layers arranged on the display panel completely, on the one hand, the circular polarizer cannot shade the ambient light irradiating the metal layers completely, and on the other hand, the circular polarizer would shade useful ambient light irradiating the region outside the metal layers. In this case, the brightness of the display panel would be reduced to a large extent. In order to compensate the brightness decrease thereof, the power consumption of the display panel needs to be increased accordingly. However, if the power consumption of the display panel is increased, the lifetime of the display panel would be shortened to a large extent, and the total thickness thereof would be increased.

SUMMARY OF THE INVENTION

The present disclosure aims to solve the technical problem of preventing the ambient light from irradiating the metal layers of the display panel in the case that the power consumption of the display panel is not increased.

In order to solve the aforesaid technical problem, the present disclosure provides an array substrate, a manufacturing method and a display device thereof.

According to a first aspect of the present disclosure, an array substrate is provided, comprising:
a base substrate;
a light-absorbing layer arranged on said base substrate; and
a bottom-gate thin film transistor unit arranged on said light-absorbing layer,
wherein a projection of said light-absorbing layer covers a gate metal layer, a source metal layer, and a drain metal layer of said bottom-gate thin film transistor unit.

Preferably, the projection of said light-absorbing layer further covers the active layer of said bottom-gate thin film transistor unit.

Preferably, said light-absorbing layer is an organic light-absorbing layer.

Preferably, said bottom-gate thin film transistor unit comprises:
said gate metal layer arranged on said light-absorbing layer;
a gate insulation layer arranged on said gate metal layer;
an active layer arranged on said gate insulation layer;
an etch-proof layer arranged on said active layer, said etch-proof layer being provided with a first via hole and a second via hole; and
said source metal layer and said drain metal layer arranged on said etch-proof layer, wherein said source metal layer and said drain metal layer are connected with said active layer through said first via hole and said second via hole respectively.

According to a second aspect of the present disclosure, a display device comprising the aforesaid array substrate is provided.

Preferably, the display device further comprises:
a passivation layer arranged on said array substrate;
a pixel electrode layer arranged on said passivation layer;
a pixel insulation layer arranged on said pixel electrode layer;
an organic layer arranged on said pixel insulation layer;
a cathode metal layer arranged on said organic layer; and According to a third aspect of the present disclosure, a method for manufacturing the array substrate is provided, comprising:
providing a base substrate; and
forming a light-absorbing layer and a bottom-gate thin film transistor unit on said base substrate, so that a projection of said light-absorbing layer covers a gate metal layer, a source metal layer, and a drain metal layer of said bottom-gate thin film transistor unit.

Preferably, forming a light-absorbing layer and a bottom-gate thin film transistor unit on said base substrate comprises forming said light-absorbing layer and said gate metal layer on said base substrate, and forming said light-absorbing layer and said gate metal layer on said base substrate comprises:
depositing a light-absorbing layer and a gate metal layer on said base substrate in sequence;
coating said gate metal layer with photoresist;
exposing and developing said photoresist with a gray-tone photomask or a half-tone photomask so as to form an unexposed photoresist profile, a partly exposed photoresist profile, and a totally exposed region;

removing a gate metal layer and a light-absorbing layer bare outside the photoresist through a first etching procedure;

removing the photoresist outside said unexposed photoresist profile through a first ashing procedure;

removing the gate metal layer outside said unexposed photoresist profile through a second etching procedure; and removing residual photoresist through a second ashing procedure.

Preferably, exposing and developing said photoresist with a gray-tone photomask or a half-tone photomask so as to form an unexposed photoresist profile, a partly exposed photoresist profile, and a totally exposed region specifically comprise:

exposing said photoresist with a gray-tone photomask or a half-tone photomask so as to form an unexposed region, a partly exposed region, and said totally exposed region; and removing the photoresist in said totally exposed region totally, removing the photoresist in said partly exposed region partly so as to form said partly exposed photoresist profile, and reserving the photoresist in said unexposed region so as to form said unexposed photoresist profile through developing.

Preferably, forming a light-absorbing layer and a bottom-gate thin film transistor unit on said base substrate further comprises:

forming a gate insulation layer on said gate metal layer;

forming an active layer on said gate insulation layer;

forming an etch-proof layer on said active layer, and forming a first via hole and a second via hole in said etch-proof layer; and forming said source metal layer and said drain metal layer on said etch-proof layer, and connecting said source metal layer and said drain metal layer with said active layer through said first via hole and said second via hole respectively.

Compared with the prior art, one embodiment or a plurality of embodiments according to the present disclosure may have the following advantages or beneficial effects.

According to the present disclosure, the array substrate is provided with the light-absorbing layer with the projection thereof covering the metal layers of the bottom-gate thin film transistor unit so as to prevent the ambient light from irradiating the metal layers of the bottom-gate thin film transistor unit effectively. In addition, the light-absorbing layer would not shade the useful ambient light irradiating the region outside the metal layers, and thus the brightness of the display panel would not be reduced. Therefore, the phenomena that the power consumption of the display panel is increased and the lifetime of the display panel is shortened resulted from use of circular polarizer in the prior art can be avoided.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure and constitute one part of the description. The drawings are used for interpreting the present disclosure together with the embodiments, not for limiting the present disclosure. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no conflict, all the technical features mentioned in all the embodiments may be combined together in any manner, and the technical solutions obtained in this manner all fall within the scope of the present disclosure.

In order to prevent the ambient light from irradiating the metal layers of the display panel in the case that the power consumption of the display panel is not increased, the embodiment of the present disclosure provides an array substrate.

Figure 1:
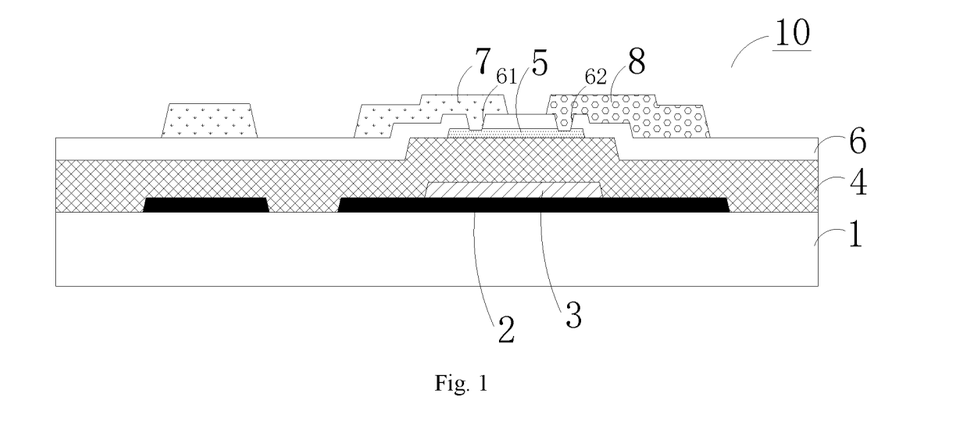
FIG. 1 schematically shows a structure of an array substrate according to an embodiment of the present disclosure.

FIG. 1 schematically shows a structure of the array substrate 10 according to the embodiment of the present disclosure. The array substrate 10 mainly comprises a base substrate 1, a light-absorbing layer 2, and a bottom-gate thin film transistor unit. The light-absorbing layer 2 is arranged on the base substrate 1, and the bottom-gate thin film transistor unit is arranged on the light-absorbing layer 2. A direction of the light-absorbing layer 2 facing the base substrate 1 is a light-exiting direction. In addition, the light-absorbing layer 2 shall be arranged in a manner so that a projection of the light-absorbing layer 2 covers a gate metal layer 3, a source metal layer 7, and a drain metal layer 8 of the bottom-gate thin film transistor unit.

According to the present embodiment, the array substrate 10 is provided with the light-absorbing layer 2 with the projection thereof covering the metal layers of the bottom-gate thin film transistor unit so as to prevent the ambient light from irradiating the metal layers of the bottom-gate thin film transistor unit effectively. In addition, the light-absorbing layer 2 would not shade the useful ambient light irradiating the region outside the metal layers, and thus the brightness of the display panel would not be reduced. Therefore, the phenomena that the power consumption of the display panel is increased and the lifetime of the display panel is shortened resulted from use of circular polarizer in the prior art can be avoided.

In the thin film transistor unit, a conductive channel is formed in an active layer 5, so that electric signals can be transmitted between the source metal layer 7 and the drain metal layer 8. However, the carrier-transmitting capacity of the conductive channel in the active layer 5 would be affected by the light irradiation, and thus the work effect of the thin film transistor unit would be affected. Therefore, according to one preferred embodiment of the present disclosure, as shown in FIG. 1, in addition to the metal layers of the bottom-gate thin film transistor unit, the projection of the light-absorbing layer 2 further covers the active layer 5 of the bottom-gate thin film transistor unit. According to the present embodiment, the light-absorbing layer 2 can prevent the ambient light from irradiating the active layer 5, so that the carrier-transmitting capacity of the conductive channel in the active layer 5 can be improved, and the work effect of the thin film transistor unit can be improved accordingly.

According to the present embodiment, the light-absorbing layer 2 can be an organic light-absorbing layer such as a black matrix, or can be an inorganic light-absorbing layer such as a black metal layer. According to one preferred embodiment of the present disclosure, the light-absorbing layer 2 is preferably an organic light-absorbing layer.

As shown in FIG. 1 again, according to one preferred embodiment of the present disclosure, the bottom-gate thin film transistor unit comprises a gate metal layer 3, a gate insulation layer 4, an active layer 5, an etch-proof layer 6, a source metal layer 7, and a drain metal layer 8.

Specifically, the gate metal layer 3 is arranged on the light-absorbing layer 2, the gate insulation layer 4 is arranged on the gate metal layer 3, the active layer 5 is arranged on the gate insulation layer 4, and the etch-proof layer 6 is arranged on the active layer 5 and provided with a first via hole 61 and a second via hole 62. The source metal layer 7 and the drain metal layer 8 are both arranged on the etch-proof layer 6. The source metal layer 7 is connected with the active layer 5 through the first via hole 61, and the drain metal layer 8 is connected with the active layer 5 through the second via hole 62.

Figure 2:
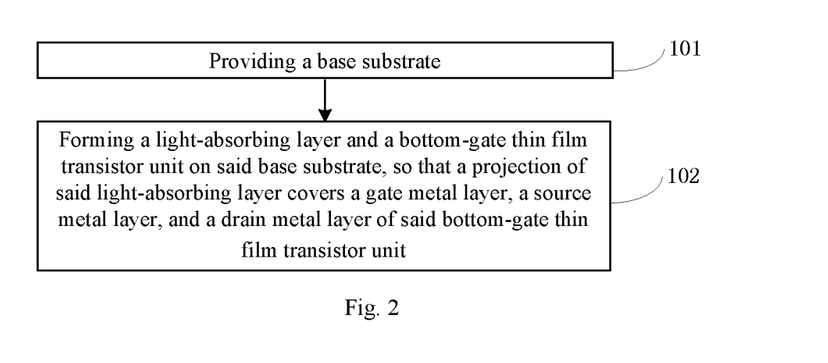
FIG. 2 is a flow chart of a method for manufacturing the array substrate according to the embodiment of the present disclosure.

FIG. 2 is a flow chart of a method for manufacturing the array substrate 10 according to the embodiment of the present disclosure. The method for manufacturing the array substrate 10 mainly comprises the following steps.

In step 101, a base substrate 1 is provided.

In step 102, a light-absorbing layer 2 and a bottom-gate thin film transistor unit are formed on the base substrate 1, so that a projection of the light-absorbing layer 2 covers a gate metal layer 3, a source metal layer 7, and a drain metal layer 8 of the bottom-gate thin film transistor unit. Specifically, the method for forming the light-absorbing layer 2 and the gate metal layer 3 of the bottom-gate thin film transistor unit on the base substrate 1 will be illustrated hereinafter with reference to FIG. 3 and FIGS. 4a to 4f.

According to the present embodiment, the array substrate 10 is provided with the light-absorbing layer 2 with the projection thereof covering the metal layers of the bottom-gate thin film transistor unit so as to prevent the ambient light from irradiating the metal layers of the bottom-gate thin film transistor unit effectively. In this case, the display effect of the display panel can be guaranteed, and the manufacturing cost thereof can be reduced. In addition, the light-absorbing layer 2 would not shade the useful ambient light irradiating the region outside the metal layers, and thus the brightness of the display panel would not be reduced. Therefore, the phenomena that the power consumption of the display panel is increased and the lifetime of the display panel is shortened resulted from use of circular polarizer in the prior art can be avoided.

Figure 3:
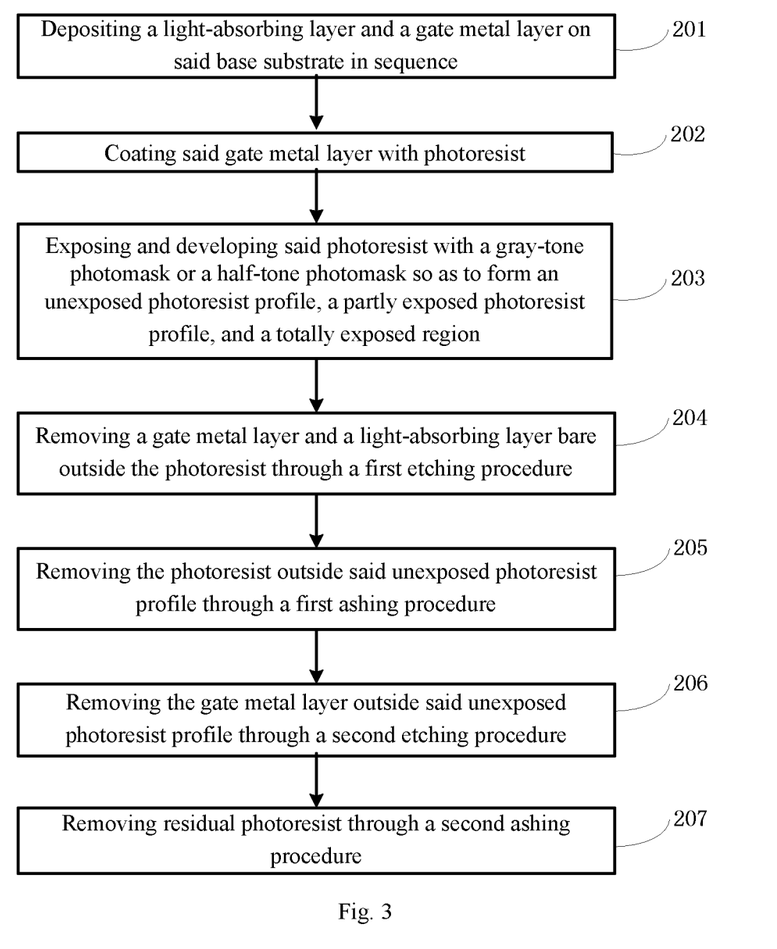
FIG. 3 is a flow chart of a method for forming a light-absorbing layer and a gate metal layer according to the embodiment of the present disclosure.

FIG. 3 is a flow chart of a method for forming the light-absorbing layer 2 and the gate metal layer 3 according to the embodiment of the present disclosure. The method for forming the light-absorbing layer 2 and the gate metal layer 3 mainly comprises the following steps.

In step 201, a light-absorbing layer 2 and a gate metal layer 3 are deposited on the base substrate 1 in sequence.

In step 202, the gate metal layer 3 is coated with photoresist 9.

Figure 4A:
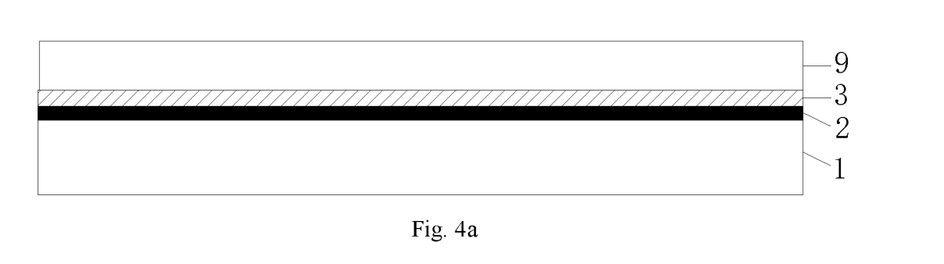
FIG. 4a schematically shows a structure after a light-absorbing layer, a gate metal layer, and photoresist are deposited on a base substrate in sequence in the method for forming the light-absorbing layer and the gate metal layer according to the embodiment of the present disclosure.

Specifically, FIG. 4a schematically shows a structure after the light-absorbing layer 2, the gate metal layer 3, and the photoresist 9 are deposited on the base substrate 1 in sequence. The thickness of the light-absorbing layer 2 is preferably 800 to 4000 Å. In addition, the material of the gate metal layer 3 is preferably chrome, molybdenum, aluminium, copper, etc.

In step 203, the photoresist are exposed and developed with a gray-tone photomask or a half-tone photomask, so that an unexposed photoresist profile, a partly exposed photoresist profile, and a totally exposed region can be formed.

Specifically, the photoresist 9 is exposed with a gray-tone photomask or a half-tone photomask, so that an unexposed region, a partly exposed region, and the totally exposed region can be formed. Then, by means of developing, the photoresist 9 in said totally exposed region is removed totally, the photoresist 9 in said partly exposed region is removed partly, so that the partly exposed photoresist profile can be formed, and the photoresist 9 in said unexposed region is reserved, so that the unexposed photoresist profile can be formed.

Figure 4B:
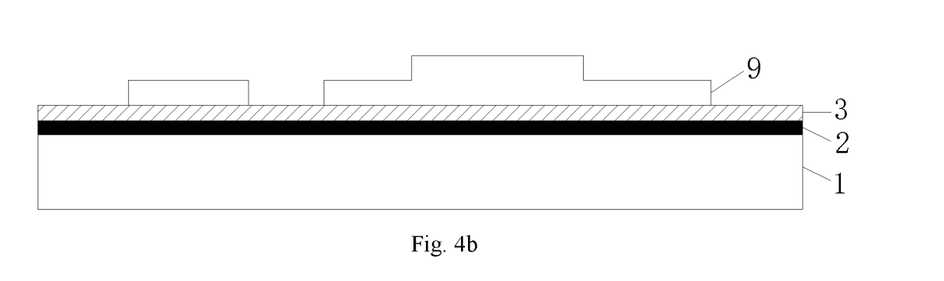
FIG. 4b schematically shows a structure after exposing and developing procedures in the method for forming the light-absorbing layer and the gate metal layer according to the embodiment of the present disclosure.
Figure 5:
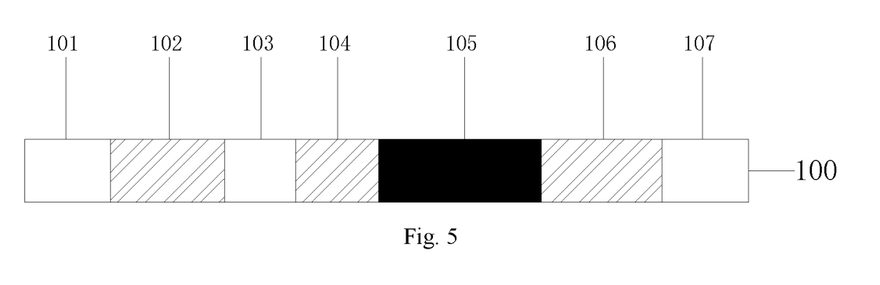
FIG. 5 schematically shows a structure of a half-tone photomask used for forming an organic light-absorbing layer and the gate metal layer according to the embodiment of the present disclosure.

According to the present embodiment, a structure of the half-tone photomask 100 is shown in FIG. 5. The half-tone photomask 100 can be divided into seven regions arranged in sequence. A first region 101, a third region 103, and a seventh region 107 are all totally transparent regions, a second region 102, a fourth region 104, and a sixth region 106 are all partly transparent regions, and a fifth region 105 is a nontransparent region. The structure of the photoresist 9 that is coated in step 202 after being exposed and developed by the half-tone photomask 100 as shown in FIG. 5 is shown in FIG. 4b. The photoresist 9 corresponding to the totally transparent region is removed totally, the photoresist 9 corresponding to the partly transparent region is removed partly so as to form the partly exposed photoresist profile, and the photoresist 9 corresponding to the nontransparent region is reserved so as to form the unexposed photoresist profile.

In step 204, a gate metal layer 3 and a light-absorbing layer 2 bare outside the photoresist 9 are removed through a first etching procedure.

Figure 4C:
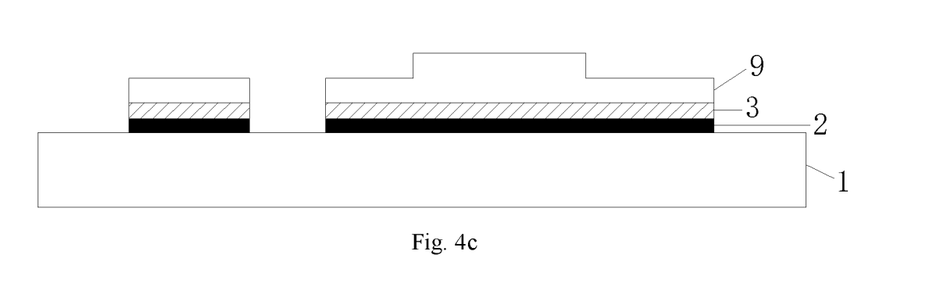
FIG. 4c schematically shows a structure after a first etching procedure in the method for forming the light-absorbing layer and the gate metal layer according to the embodiment of the present disclosure.

Specifically, the gate metal layer 3 and the light-absorbing layer 2 in the totally exposed region are both removed through the first etching procedure (preferably a first wet etching procedure). The structure after the first etching procedure is shown in FIG. 4c.

In step 205, the photoresist 9 outside the unexposed photoresist profile is removed through a first ashing procedure.

Figure 4D:
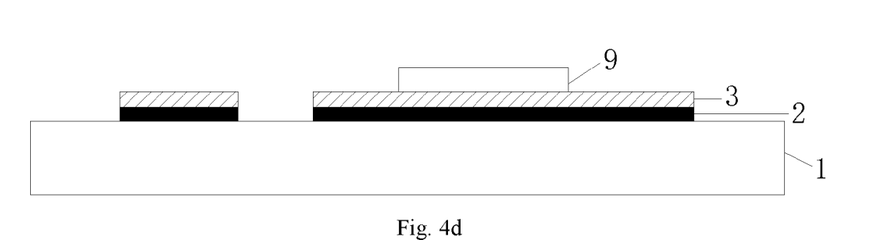
FIG. 4d schematically shows a structure after a first ashing procedure is performed on the photoresist in the method for forming the light-absorbing layer and the gate metal layer according to the embodiment of the present disclosure.

Specifically, the unnecessary photoresist 9, i.e., the photoresist 9 outside the unexposed photoresist profile, is removed through the first ashing procedure. The structure after the first ashing procedure is shown in FIG. 4d.

In step 206, the gate metal layer 3 outside the unexposed photoresist profile is removed through a second etching procedure.

Figure 4E:
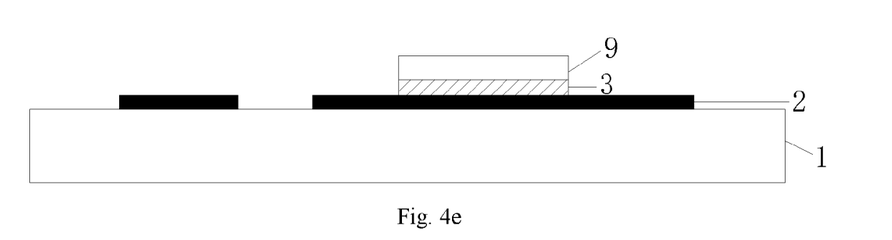
FIG. 4e schematically shows a structure after a second etching procedure in the method for forming the light-absorbing layer and the gate metal layer according to the embodiment of the present disclosure.

Specifically, the gate metal layer 3 outside the unexposed photoresist profile is removed through the second etching procedure (preferably a second wet etching procedure). The structure after the second etching procedure is shown in FIG. 4e.

In step 207, residual photoresist 9 is removed through a second ashing procedure.

Figure 4F:
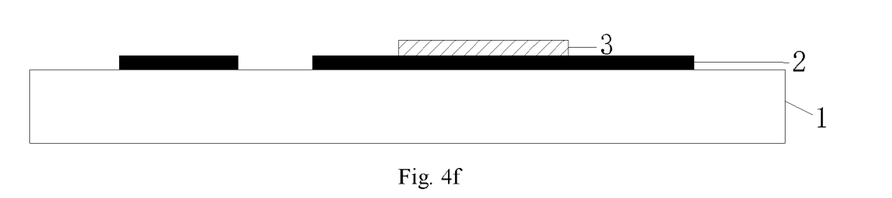
FIG. 4f schematically shows a structure after a second ashing procedure is performed on the photoresist in the method for forming the light-absorbing layer and the gate metal layer according to the embodiment of the present disclosure.

Specifically, as shown in FIG. 4f, the light-absorbing layer 2 and the gate metal layer 3 as shown in FIG. 1 can be formed after the residual photoresist 9 is removed through the second ashing procedure.

According to the present embodiment, the two exposing and developing procedures for forming the light-absorbing layer 2 and the gate metal layer 3 in the prior art can be combined into one exposing and developing procedure by the gray-tone photomask or the half-tone photomask. In this manner, not only the production efficiency thereof can be improved, but also the performance of the array substrate 10 can be guaranteed.

According to the embodiment of the present disclosure, the method for forming the bottom-gate thin film transistor unit on the base substrate 1 further comprises the following steps.

In step 301, a gate insulation layer 4 is formed on the gate metal layer 3.

Specifically, the gate metal layer 3 is coated with an inorganic film (SiOx or SiOx/SiNx) with a suitable thickness (preferably 2000 to 5000 Å), so as to form the gate insulation layer 4.

In step 302, an active layer 5 is formed on the gate insulation layer 4.

Specifically, the method for forming the active layer 5 on the gate insulation layer 4 comprises the following steps. First, a semiconductor film layer (ZnO, InZnO, ZnSnO, GaInZnO, or ZrInZnO) with a suitable thickness (preferably 200 to 2000 Å) is deposited on the gate insulation layer 4. Second, the semiconductor film layer is coated with photoresist, and the photoresist is exposed and developed by the gray-tone photomask or the half-tone photomask. Then, the semiconductor film bare outside the photoresist is removed through a wet etching procedure. And at last, the residual photoresist is removed through an ashing procedure, and the residual semiconductor film is the active layer 5.

In step 303, an etch-proof layer 6 is formed on the active layer 5, and the etch-proof layer 6 is provided with a first via hole and a second via hole.

Specifically, the method for forming the etch-proof layer 6 on the active layer 5 comprises the following steps. First, the active layer 5 is coated with an inorganic film (SiOx) with a suitable thickness (preferably 500 to 2000 Å). Second, the inorganic film is coated with photoresist, and the photoresist is exposed and developed by a photomask. Then, the inorganic film bare outside the photoresist is removed through a dry etching procedure. And at last, the residual photoresist is removed through an ashing procedure, and the residual inorganic film is the etch-proof layer 6 with the first via hole and the second via hole.

In step 304, the source metal layer 7 and the drain metal layer 8 are formed on the etch-proof layer 6, and they are connected with the active layer 5 through the first via hole and the second via hole respectively.

Specifically, the method for forming the source metal layer 7 and the drain metal layer 8 on the etch-proof layer 6 comprises the following steps. First, a metal layer with a suitable thickness (preferably 1000 to 6000 Å) is deposited on the etch-proof layer 6. Second, the metal layer is coated with photoresist, and the photoresist is exposed and developed by a photomask. Then, the metal layer bare outside the photoresist is removed through a wet etching procedure. And at last, the residual photoresist is removed through an ashing procedure, and the residual metal layer is the source metal layer 7 and the drain metal layer 8.

The embodiment of the present disclosure further provides a display device comprising the aforesaid array substrate 10.

Figure 6:
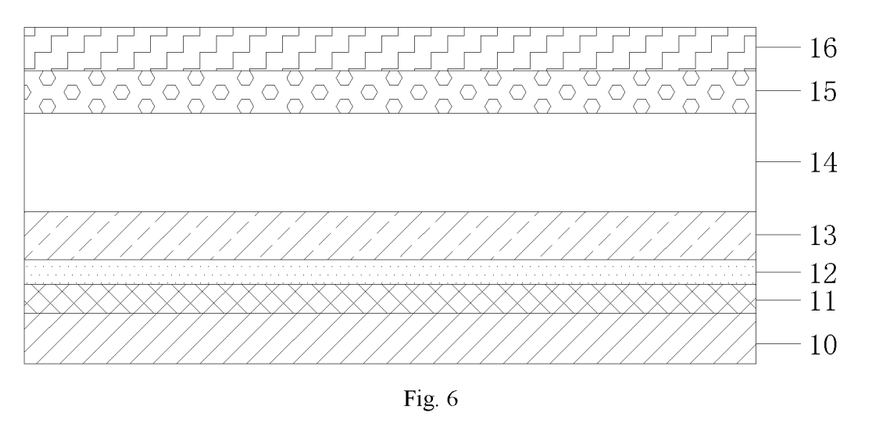
FIG. 6 schematically shows a structure of a display device according to the embodiment of the present disclosure.

FIG. 6 schematically shows a structure of the display device according to the embodiment of the present disclosure. The display device according to the present embodiment comprises the array substrate 10, a passivation layer 11, a pixel electrode layer 12, a pixel insulation layer 13, an organic layer 14, a cathode metal layer 15, and a packaging cover 16.

Specifically, the passivation layer 11 is arranged on the array substrate 10, the pixel electrode layer 12 is arranged on the passivation layer 11, the pixel insulation layer 13 is arranged on the pixel electrode layer 12, the organic layer 14 is arranged on the pixel insulation layer 13, the cathode metal layer 15 is arranged on the organic layer 14, and the packaging cover 16 is arranged on the cathode metal layer 15.

In addition to the method for manufacturing the array substrate 10, the method for manufacturing the display device further comprises the following steps.

In step 401, the passivation layer 11 is formed on the array substrate 10.

Specifically, the method for forming the passivation layer 11 on the array substrate 10 comprises the following steps. First, the array substrate 10 is coated with a protection film (SiOx or SiOx/SiNx) with a suitable thickness (preferably 2000 to 4000 Å). Second, the protection film is coated with photoresist, and the photoresist is exposed and developed by a photomask. Then, the protection film bare outside the photoresist is removed through a dry etching procedure. And at last, the residual photoresist is removed through an ashing procedure, and the residual protection film is the passivation layer 11.

In step 402, the pixel electrode layer 12 is formed on the passivation layer 11.

Specifically, the method for forming the pixel electrode layer 12 on the passivation layer 11 comprises the following steps. First, the passivation layer 11 is coated with a transparent electrode (ITO or IZO) with a suitable thickness (preferably 100 to 1000 Å). Second, the transparent electrode is coated with photoresist, and the photoresist is exposed and developed by a photomask. Then, the transparent electrode bare outside the photoresist is removed through a wet etching procedure. And at last, the residual photoresist is removed through an ashing procedure, and the residual transparent electrode is the pixel electrode layer 12.

In step 403, the pixel insulation layer 13 is formed on the pixel electrode layer 12.

Specifically, the method for forming the pixel insulation layer 13 on the pixel electrode layer 12 comprises the following steps. First, the pixel electrode layer 12 is coated with an inorganic film (SiOx) with a suitable thickness (preferably 500 to 2000 Å). Second, the inorganic film is coated with photoresist, and the photoresist is exposed and developed by a photomask. Then, the inorganic film bare outside the photoresist is removed through a wet etching procedure. And at last, the residual photoresist is removed through an ashing procedure, and the residual inorganic film is the pixel insulation layer 13.

In step 404, the organic layer 14 is formed on the pixel insulation layer 13.

In step 405, the cathode metal layer 15 is formed on the organic layer 14.

In step 406, the packaging cover 16 is installed.

Specifically, an electron-hole injection layer, an electron-hole transmission layer, an organic light-emitting layer, an electron transmission layer, and an electron injection layer are formed on the pixel insulation layer 13 through a vapor plating procedure, so as to form the organic layer 14. Then, the cathode metal layer 15 is formed on the organic layer 14 through a sputtering procedure. At last, the display panel is packaged through a packaging procedure.

According to the present embodiment, the array substrate 10 is provided with the light-absorbing layer 2 with the projection thereof covering the metal layers of the bottom-gate thin film transistor unit so as to prevent the ambient light from irradiating the metal layers of the bottom-gate thin film transistor unit effectively. In this case, the display effect of the display panel can be guaranteed, and the manufacturing cost thereof can be reduced. In addition, the light-absorbing layer 2 would not shade the useful ambient light irradiating the region outside the metal layers, and thus the brightness of the display panel would not be reduced. Therefore, the phenomena that the power consumption of the display panel is increased and the lifetime of the display panel is shortened resulted from use of circular polarizer in the prior art can be avoided.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A display device, comprising:
   an array substrate, wherein said array substrate comprises:
   a base substrate;
   a light-absorbing layer arranged on said base substrate; and
   a bottom-gate thin film transistor unit arranged on said light-absorbing layer,
   wherein a projection of said light-absorbing layer covers a gate metal layer, a source metal layer, and a drain metal layer of said bottom-gate thin film transistor unit;
   a passivation layer arranged on said array substrate;
   a pixel electrode layer arranged on said passivation layer;
   a pixel insulation layer arranged on said pixel electrode layer;
   an organic layer arranged on said pixel insulation layer;
   a cathode metal layer arranged on said organic layer; and
   a packaging cover arranged on said cathode metal layer.

2. The display device according to claim 1, wherein said light-absorbing layer is an organic light-absorbing layer.

3. The display device according to claim 2, further comprising:
   a passivation layer arranged on said array substrate;
   a pixel electrode layer arranged on said passivation layer;
   a pixel insulation layer arranged on said pixel electrode layer;
   an organic layer arranged on said pixel insulation layer;
   a cathode metal layer arranged on said organic layer; and
   a packaging cover arranged on said cathode metal layer.

4. The display device according to claim 1, wherein said bottom-gate thin film transistor unit comprises:
   said gate metal layer arranged on said light-absorbing layer;
   a gate insulation layer arranged on said gate metal layer;
   an active layer arranged on said gate insulation layer;
   an etch-proof layer arranged on said active layer, said etch-proof layer being provided with a first via hole and a second via hole; and
   said source metal layer and said drain metal layer arranged on said etch-proof layer, wherein said source metal layer and said drain metal layer are connected with said active layer through said first via hole and said second via hole respectively.

5. The display device according to claim 4, further comprising:
   a passivation layer arranged on said array substrate;
   a pixel electrode layer arranged on said passivation layer;
   a pixel insulation layer arranged on said pixel electrode layer;
   an organic layer arranged on said pixel insulation layer;
   a cathode metal layer arranged on said organic layer; and
   a packaging cover arranged on said cathode metal layer.

6. The display device according to claim 1, wherein the projection of said light-absorbing layer further covers the active layer of said bottom-gate thin film transistor unit.

7. The display device according to claim 6, wherein said light-absorbing layer is an organic light-absorbing layer.

8. The display device according to claim 6, wherein said bottom-gate thin film transistor unit comprises:
   said gate metal layer arranged on said light-absorbing layer;
   a gate insulation layer arranged on said gate metal layer;
   an active layer arranged on said gate insulation layer;
   an etch-proof layer arranged on said active layer, said etch-proof layer being provided with a first via hole and a second via hole; and
   said source metal layer and said drain metal layer arranged on said etch-proof layer, wherein said source metal layer and said drain metal layer are connected with said active layer through said first via hole and said second via hole respectively.

9. A method for manufacturing an array substrate, comprising:
   providing a base substrate; and
   forming a light-absorbing layer and a bottom-gate thin film transistor unit on said base substrate, so that a projection of said light-absorbing layer covers a gate metal layer, a source metal layer, and a drain metal layer of said bottom-gate thin film transistor unit;

wherein forming a light-absorbing layer and a bottom-gate thin film transistor unit on said base substrate comprises forming said light-absorbing layer and said gate metal layer on said base substrate, and forming said light-absorbing layer and said gate metal layer on said base substrate comprises:

depositing a light-absorbing layer and a gate metal layer on said base substrate in sequence;

coating said gate metal layer with photoresist;

exposing and developing said photoresist with a gray-tone photomask or a half-tone photomask so as to form an unexposed photoresist profile, a partly exposed photoresist profile, and a totally exposed region;

removing a gate metal layer and a light-absorbing layer bare outside the photoresist through a first etching procedure;

removing the photoresist outside said unexposed photoresist profile through a first ashing procedure;

removing the gate metal layer outside said unexposed photoresist profile through a second etching procedure; and removing residual photoresist through a second ashing procedure.

10. The method according to claim 9, wherein forming a light-absorbing layer and a bottom-gate thin film transistor unit on said base substrate further comprises:

forming a gate insulation layer on said gate metal layer;

forming an active layer on said gate insulation layer;

forming an etch-proof layer on said active layer, and forming a first via hole and a second via hole in said etch-proof layer; and forming said source metal layer and said drain metal layer on said etch-proof layer, and connecting said source metal layer and said drain metal layer with said active layer through said first via hole and said second via hole respectively.

11. The method according to claim 9, wherein exposing and developing said photoresist with a gray-tone photomask or a half-tone photomask so as to form an unexposed photoresist profile, a partly exposed photoresist profile, and a totally exposed region specifically comprises:

exposing said photoresist with a gray-tone photomask or a half-tone photomask so as to form an unexposed region, a partly exposed region, and said totally exposed region; and removing the photoresist in said totally exposed region totally, removing the photoresist in said partly exposed region partly so as to form said partly exposed photoresist profile, and reserving the photoresist in said unexposed region so as to form said unexposed photoresist profile through developing.

12. The method according to claim 11, wherein forming a light-absorbing layer and a bottom-gate thin film transistor unit on said base substrate further comprises:

forming a gate insulation layer on said gate metal layer;

forming an active layer on said gate insulation layer;

forming an etch-proof layer on said active layer, and forming a first via hole and a second via hole in said etch-proof layer; and forming said source metal layer and said drain metal layer on said etch-proof layer, and connecting said source metal layer and said drain metal layer with said active layer through said first via hole and said second via hole respectively.

* * * * *